(12) United States Patent
Antol et al.

(10) Patent No.: US 7,888,257 B2
(45) Date of Patent: Feb. 15, 2011

(54) INTEGRATED CIRCUIT PACKAGE INCLUDING WIRE BONDS

(75) Inventors: Joze Eura Antol, Hamburg, PA (US); John William Osenbach, Kutztown, PA (US); Ronald James Weachock, Pottsville, PA (US)

(73) Assignee: Agere Systems Inc., Allentown, PA (US)

( * ) Notice: Subject to any disclaimer, the term of this patent is extended or adjusted under 35 U.S.C. 154(b) by 360 days.

(21) Appl. No.: 11/973,859

(22) Filed: Oct. 10, 2007

(65) Prior Publication Data
US 2009/0098687 A1    Apr. 16, 2009

(51) Int. Cl.
*H01L 21/44*    (2006.01)
(52) U.S. Cl. ............... 438/612; 438/617; 257/E21.509
(58) Field of Classification Search ............ 438/612, 438/617; 257/E21.509
See application file for complete search history.

(56) References Cited

U.S. PATENT DOCUMENTS

| | | | |
|---|---|---|---|
| 5,106,461 A | 4/1992 | Volfson et al. | |
| 5,128,737 A | 7/1992 | van der Have | |
| 5,248,903 A | 9/1993 | Heim | |
| 5,302,550 A * | 4/1994 | Hirota et al. | 438/106 |
| 5,656,858 A | 8/1997 | Kondo et al. | |
| 5,659,201 A | 8/1997 | Wollesen | |
| 5,686,762 A * | 11/1997 | Langley | 257/775 |
| 5,751,065 A | 5/1998 | Chittipeddi et al. | |
| 5,854,514 A | 12/1998 | Roldan et al. | |
| 5,933,715 A * | 8/1999 | Igel et al. | 438/149 |
| 6,037,664 A | 3/2000 | Zhao et al. | |
| 6,187,680 B1 | 2/2001 | Costrini et al. | |
| 6,198,170 B1 | 3/2001 | Zhao | |
| 6,222,270 B1 | 4/2001 | Lee | |
| 6,306,750 B1 | 10/2001 | Huang et al. | |
| 6,350,705 B1 | 2/2002 | Lin | |
| 6,358,831 B1 * | 3/2002 | Liu et al. | 438/612 |
| 6,400,021 B1 * | 6/2002 | Cho | 257/738 |
| 6,426,556 B1 | 7/2002 | Lin | |
| 6,440,833 B1 | 8/2002 | Lee et al. | |

(Continued)

FOREIGN PATENT DOCUMENTS

JP    2004207509 A    7/2004

(Continued)

OTHER PUBLICATIONS

Antol et al., "Bond Pad Support Structure for Semiconductor Device," PCT/US2007/083183 International Search Report, Jul. 18, 2008, PCT Publication No. WO 2009/058143 (3 pages).

*Primary Examiner*—David A Zarneke
(74) *Attorney, Agent, or Firm*—Mendelsohn, Drucker & Associates, P.C.; Edward J. Meisarosh; Steve Mendelsohn

(57) ABSTRACT

It has been found that integrated packages having dies with at least 10 bonding pads separated by a pitch of 65 μm or less are susceptible to corrosion upon wire bonding to these pads and subsequent encapsulation in a passivating material. In particular, crevices are potentially formed between the bonding wire and bonding pad that are not passivated and that promote corrosion. Avoidance of crevice formation through, for example, appropriately choosing the bonding pad and wire configuration substantially avoids such corrosion.

15 Claims, 4 Drawing Sheets

U.S. PATENT DOCUMENTS

| | | | |
|---|---|---|---|
| 6,500,748 B2 * | 12/2002 | Anand | 438/612 |
| 6,531,384 B1 * | 3/2003 | Kobayashi et al. | 438/612 |
| 6,563,216 B1 | 5/2003 | Kimura et al. | |
| 6,596,622 B2 * | 7/2003 | Okada | 438/617 |
| 6,620,720 B1 | 9/2003 | Moyer et al. | |
| 6,642,597 B1 | 11/2003 | Burke et al. | |
| 6,664,578 B2 | 12/2003 | Lee et al. | |
| 6,689,680 B2 | 2/2004 | Greer | |
| 6,717,270 B1 | 4/2004 | Downey et al. | |
| 6,743,979 B1 | 6/2004 | Berman et al. | |
| 6,798,035 B1 | 9/2004 | Low et al. | |
| 6,803,302 B2 * | 10/2004 | Pozder et al. | 438/612 |
| 6,825,563 B1 | 11/2004 | Ranganathan et al. | |
| 6,841,872 B1 | 1/2005 | Ha et al. | |
| 7,005,369 B2 * | 2/2006 | Gasner et al. | 438/614 |
| 7,015,129 B2 * | 3/2006 | Lai et al. | 438/612 |
| 7,049,170 B2 | 5/2006 | Savastiouk et al. | |
| 7,160,805 B1 | 1/2007 | Burke et al. | |
| 7,233,075 B2 | 6/2007 | Hung et al. | |
| 7,242,099 B2 | 7/2007 | Lin et al. | |
| 7,273,804 B2 * | 9/2007 | Angell et al. | 438/612 |
| 7,301,231 B2 | 11/2007 | Antol et al. | |
| 7,328,830 B2 | 2/2008 | Bachman et al. | |
| 7,364,998 B2 | 4/2008 | Chiu et al. | |
| 7,535,114 B2 * | 5/2009 | Agraharam et al. | 257/786 |
| 2001/0051426 A1 | 12/2001 | Pozder et al. | |
| 2003/0127502 A1 | 7/2003 | Alvarez | |
| 2003/0173637 A1 | 9/2003 | Downey et al. | |
| 2003/0173667 A1 | 9/2003 | Yong et al. | |
| 2003/0189249 A1 * | 10/2003 | Tong et al. | 257/737 |
| 2003/0222348 A1 | 12/2003 | Okada | |
| 2004/0134974 A1 | 7/2004 | Oh et al. | |
| 2004/0201101 A1 | 10/2004 | Kang et al. | |
| 2006/0006552 A1 | 1/2006 | Kang et al. | |
| 2006/0289974 A1 * | 12/2006 | Saran et al. | 257/669 |
| 2008/0093596 A1 * | 4/2008 | Shin et al. | 257/48 |
| 2008/0233733 A1 | 9/2008 | Lin | 438/617 |
| 2008/0272487 A1 * | 11/2008 | Shim et al. | 257/737 |
| 2009/0015285 A1 * | 1/2009 | Farooq et al. | 324/763 |
| 2009/0079082 A1 * | 3/2009 | Liu et al. | 257/773 |

FOREIGN PATENT DOCUMENTS

| | | |
|---|---|---|
| JP | 2007227815 A | 9/2007 |
| WO | 2009058143 A1 | 5/2009 |

* cited by examiner

INTEGRATED CIRCUIT PACKAGE INCLUDING WIRE BONDS

TECHNICAL FIELD

This invention relates to integrated circuits and in particular the packaging of integrated circuits.

BACKGROUND OF THE INVENTION

In the manufacture of integrated circuits a monolithic structure is first built typically on a single crystalline silicon substrate by successive steps including material deposition, etching, and lithographic definition. That is, successive layers of materials as, for example, insulators, semiconductor materials, and metals are patterned to produce desired circuitry. At the top of this successive stacking of layers there is typically a multiplicity of bonding pads used for connecting the integrated circuit to the environment of a larger electronic assemblage. For example, as shown in FIG. 1, in plan view, the upper surface of the integrated circuit structure, 10, is shown with bonding pads, 11.

This integrated circuit structure, typically denominated a die, presently has from 10 to 10000 bonding pads with the space between adjacent bonding pads between 1 and 1000 µm. This shortest distance from the center of one bonding pad to the center of an adjacent bonding pad is defined as the pitch of the bonding pad array. (Center in this context is defined as the point C of Cartesian coordinates X and Y that satisfy the two relationships $$\int_A x \partial A = Ax \text{ and } \int_A y \partial A = Ay$$

where A is the area of the pad. Such integral relationships are particularly simple for symmetric pads. For example, for a square, C is at x=½ length and y=½ width; for a circle C is at x=½ diameter and y=½ diameter.) Although such bonding pads are typically ordered in perpendicular rows and columns, such regular ordering is not critical and the term array subsumes all bond pad configurations.

The die is packaged in a structure, 20, shown in FIG. 2. The die, 10, with bonding pads, 11, is adhered to substrate, 15, using, for example, a polymer, 16, (e.g. epoxy polymeric die attach material that is sold by any of a number of commercial suppliers such as Ablestik Corporation located at Susana Road, Rancho Dominguez, Calif.). The bonding pads on the die are used to connect the interconnect die circuit metallization to external pads in the package, 12, with wires, 14. The wires are generally gold or high gold content alloys (typically at least 99% by weight gold) having diameters in the range 10 to 30 µm. The entire structure is then encapsulated in a material such as a polymer material, e.g. mold compound material that is sold by any of a number of commercial suppliers such as Nitto Denko Corporation of Herbis Osaka, 2-5-25, Umeda, Kita-Ku, Osaka 530-0001. This encapsulation is accomplished by molding processes such as injection molding involving a flow of polymeric material into a mold cavity containing the substrate with its attached die and attendant wire bonds. The polymer flow to fill the mold cavity exerts a meaningful force on bonding wires, 14. Thus these wires should have sufficient stiffness, as primarily determined by the wire diameter, to resist their deflection into neighboring wires attached to adjoining bonding pads. Such deflection (often denominated sweep) substantially increases the potential for short circuits between these adjacent wires.

Additionally the bonding of wire, 14, to pad, 11, is accomplished typically by thermosonic bonding. As shown in FIG. 3 substrate, 31, of the die, 10, has an upper layer, 32, generally formed from undoped silica glass by processes such as chemical vapor deposition or plasma assisted chemical vapor deposition and patterned using conventional lithographic processes. A copper region, 33, is formed by electroplating and an overlying passivating region, 34, is formed from materials such as silicon dioxide, silicon nitride, carbon doped silicon dioxide or nitride, or a combination of some or all the four again using conventional deposition and lithographic processes. The bonding pad, 11, is generally a patterned aluminum containing composition that is passivated by a patterned overlying layer, 36. (Passivating materials include, for example, silicon oxides, silicon nitride, and combinations of these two.) A capillary tube, 38, is used to bond the wire, e.g. gold or gold alloy wire, 39, to bonding pad, 11. A wire portion extending beyond tip, 30, of the capillary tube is formed into a ball, 37, by applying an electric arc as described in *Wire Bonding in Microelectronics Materials Processes, Reliability, and Yield*, 2$^{nd}$ Ed., G. Harman (1997). The capillary tube, 38, is then used to apply pressure to the ball, 37, onto bonding pad, 11 while introducing ultrasonic energy along the wire through the capillary tube. As a result, formation of Al/Au intermetallic composition is induced that provides a bond interface. Typically forces in the range of 2 to 30 grams are applied to balls formed from wires having respectively diameters in the range 10 to 30 µm. (The ball diameter is typically 1.5 to 4 times the diameter of the wire. In this context, irrespective of the ball shape, its diameter is considered that of a sphere having a volume equal to that of the ball.)

As previously discussed, to avoid short circuits due to wire sweep it is desirable to employ larger wire diameters. However, as packing densities increase, bonding pad size and pitch decrease. Therefore, the physical dimensions of the die and its bonding pad array limit the diameter of the wire employed in bonding. As an accommodation to these competing considerations, generally wire diameters in the range 10 µm to 30 µm resulting in balls having diameters in the range 15 to 120 µm are employed with bonding pads having lateral dimension, 40, between edges, 41 of the passivation region, 36 overlying bonding pad, 11. Accordingly, in general a significant portion of aluminum bonding pad extends beyond the region encompassed by the diameter of ball, 37 but the wire diameter is sufficient to acceptably limit the probability of short circuit formation.

Despite the accommodations made, other problems still arise. Corrosion at the wire ball/bonding pad interface has been observed especially when the wire bonded region of the pad is exposed to corrosive materials such as bromine that are added to the mold compound to improve flame resistance. To avoid such corrosion, there has been a trend away from bromine entity containing materials. Unfortunately other corrosive elements such as moisture are omnipresent. In particular, commonly used molding compounds are fully permeated within a few days to a month under typical environmental temperature and humidity conditions. Other corrosive elements such as Cl and/or Na often remain in the molding compound after processing. Such Na and/or Cl in combination with moisture readily corrode Al and Al/Au compounds. Thus, it is a challenge to produce an adequate device even with substantial material and configuration compromises.

SUMMARY OF THE INVENTION

It has been found that in an integrated circuit package, even in the absence of bromine entities in a carefully formulated mold compound, a meaningful probability of corrosion is present. In particular, for devices having at least 10 aluminum bonding pads with a pitch of 65 μm or less, more advantageously 60 μm or less, most advantageously 55 μm or less there is a significant probability of encountering unacceptable corrosion. Although the precise atomistic mechanism for such corrosion is not precisely known, it is contemplated that such corrosion is associated with distortion of aluminum pads during the thermosonic wire bonding process and the presence of moisture and/or other corrosive species in the system.

To exemplify, as shown in FIG. 4, as the ball, 45, is compressed on aluminum bonding pad, 11, distortion of the pad in regions 47 produces a narrow crevice, 48, between the compressed metal ball, e.g. gold ball, and the distorted portion of the aluminum pad. Upon subsequent overmolding of the package, the mold compound material does not infiltrate this crevice region, 48, because of its narrow dimensions leaving the metal in the region unpassivated. As a result, water permeation through the mold compound reaches unpassivated regions 48 and acts as the electrolyte for galvanic action between dissimilar metals, i.e., the metal of the bonding ball, e.g. gold, and the aluminum of the bonding pad or the Al/Au intermetallic composition. This galvanic action is the driving force for corrosion leading to an unacceptable bond through, for example, degradation of the mechanical stability of the bond.

The invention relies on the identification of this corrosion mechanism associated with a structural die configuration having limited pitch, (i.e., 65 micrometers or less) for an array of at least 10 bonding pads. The invention involves avoiding unacceptable corrosion by employing an expedient that prevents formation of unpassivated crevices. (Unacceptable corrosion is defined as a reduction to the wire bond pull strength of at least 25% with a resultant failure occurring between the ball and the pad after exposure under any of the test conditions defined by the JEDEC Solid State Technology Association standard JEDS 22-A101. An unpassivated crevice is a region between 1) aluminum from the bonding pad and 2) the metal of the compression ball such that the crevice region has dimensions greater than 50 nm and less than 5 μm.) The invention encompasses all process structures and conditions that avoid such crevice formation in the specified device configurations. Thus invention claims lacking the explicit term "means" should not be interpreted as being limited to the explicitly disclosed embodiments.

In a first embodiment the aluminum bonding pad thickness before compression bonding should have a root-mean-square average measured in the direction perpendicular to the major surface of the substrate of less than 0.8 μm and preferably less than 0.7 μm. By maintaining a relatively thin aluminum pad the aluminum present is much less prone to distortion and crevice formation leading to unacceptable corrosion are precluded.

In a second embodiment the ball diameter is sized to be larger than the lateral distance, 40 in FIG. 3, between passivation regions overlying the aluminum pad. Thus the configuration shown in FIG. 5 is obtained. The compressed ball, 51, over aluminum bonding pad 11 is distorted over the passivation regions, 36 and thus does not cause significant distortion at an aluminum bonding pad/compression ball interface. Accordingly crevices leading to unacceptable corrosion are avoided.

In a third embodiment, a configuration shown in FIG. 6 before ball compression is employed with passivation region, 36 aluminum bonding pad, 11, and an additional passivation region, 66. Subsequent thermosonic bonding as shown in FIG. 7 allows extension of the aluminum bonding pad 11 into void regions 78 limiting distortion. Thus a subsequently unpassivated crevice is not formed.

DETAILED DESCRIPTION

As discussed, the invention relies on the realization that thermosonic bonding of a wire to an aluminum bonding pad induces deformation of the aluminum pad and the potential for crevices that promote unacceptable corrosion processes. With this realization, the invention further relies on the use of an expedient to prevent such crevice formation. An appropriate expedient in the context of the invention is the choice of appropriate wire bonding process conditions and/or structures employed in the die or the wire ball during such wire bonding processes. Although the following description for pedagogic purposes is framed in the context of three advantageous embodiments the invention is not so limited. Crevice formation, and thus the invention, is applicable to integrated circuits having a bond pad and array with a pitch between at least 10 such pads of 65 μm or less. (An integrated circuit in the context of this invention is a device that includes at least two electrical elements made in a monolithic piece of silicon. An electrical element in this context includes, for example, a transistor, a resistor, an electrical interconnect and a capacitor.)

Figure 1:
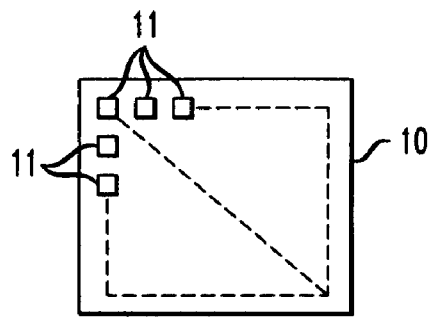
FIG. 1 illustrates bond pad configurations on an integrated circuit die.
Figure 2:
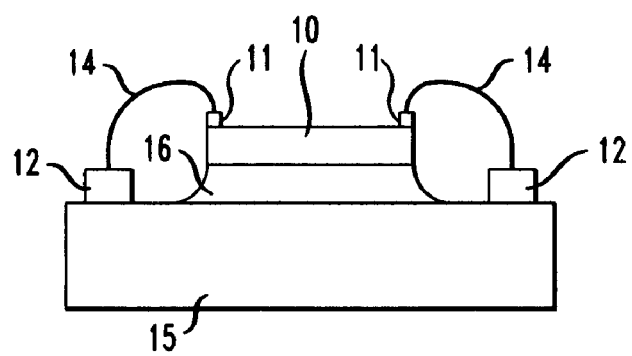
FIG. 2 shows an illustrative wire bond employed in integrated circuit packaging.
Figure 3:
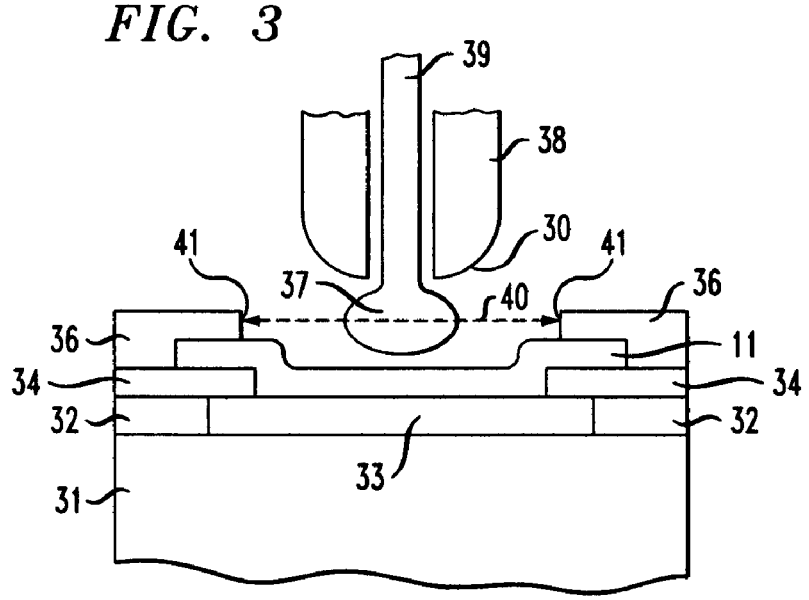
FIG. 3 exemplifies compression bonding to a bonding pad.
Figure 4:
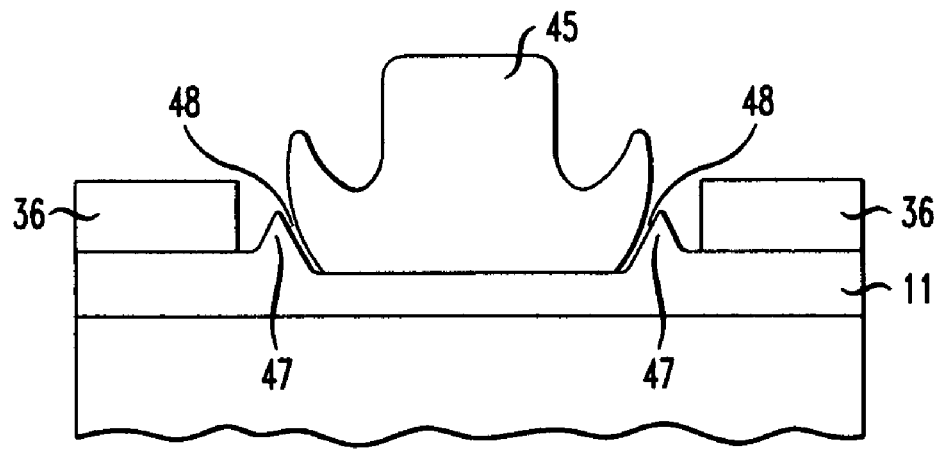
FIG. 4 illustrates the formation of crevices upon deformation of the aluminum bonding pad.
Figure 5:
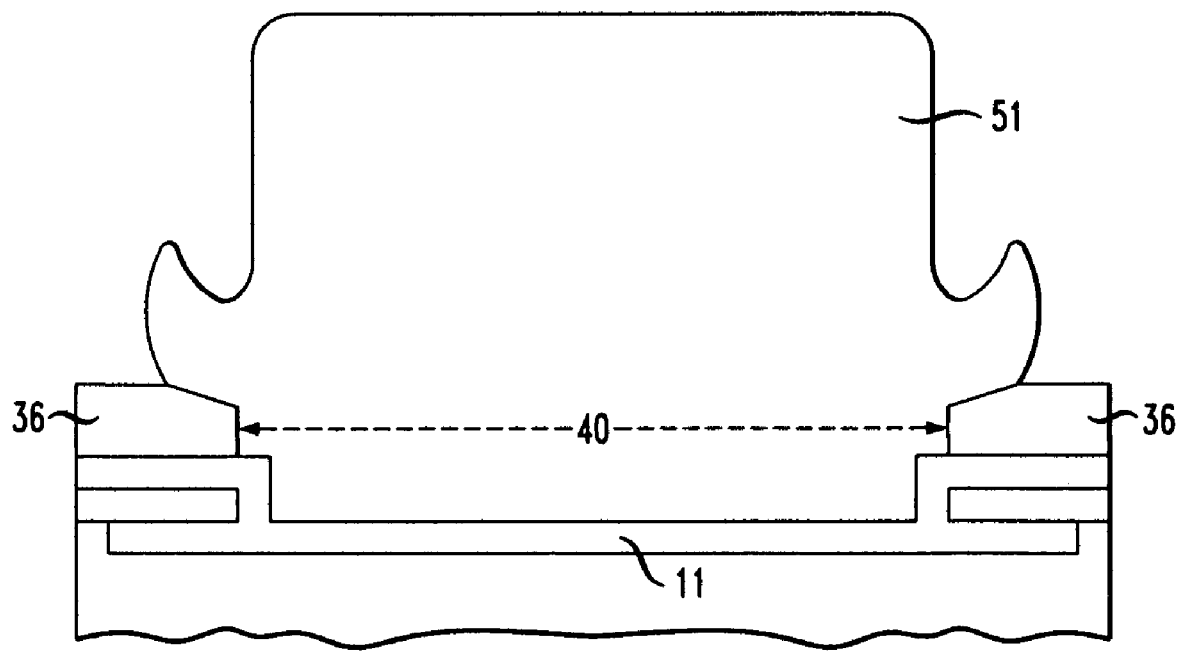
FIGS. 5 through 7 are exemplary of embodiments of the invention.

In a first embodiment, the structure shown in FIG. 5 is employed to produce a wire bond having suitable properties. In this procedure the diameter of the bonding ball before bonding is larger than the distance, 40, in FIGS. 3 and 5 between the edges of the passivation region, 36, overlying the aluminum metallization employed for the bonding pad. (Overlying as used in this description means further removed from the substrate upon which the die is built during die fabrication. An aluminum pad is one comprising aluminum, an alloy of aluminum, or doped aluminum such that the aluminum composition is at least 95 atom % aluminum.) Generally for square passivation openings having dimensions in the range 25μ by 25 μm to 65 μm by 65 μm, bonding ball diameters in the range 35 to 92 μm or greater are chosen such that the bonding ball diameter is larger than the passivation opening. (If the passivation openings vary substantially in dimension, the ball diameter should be larger than the largest opening dimension by at least 2.5%.) Pad passivation openings that are geometrically different from a square are also comprehended by the invention. For example, if the passivation opening is circular with diameter of 25 μm then the ball diameter should be greater than 25 μm to provide full coverage. Generally, for such openings and suitable bonding balls, compression forces in the range 2 to 30 grams produce suitable bonds. Pressures greater than 30 grams tend to produce mechanical instability while pressures less than 2 grams generally lead to inadequate bonding. For this embodiment, the thickness of the aluminum bond pad is not critical. Thicknesses in the range 0.3 μm to 3 μm are typically used. Thicknesses greater than 3 μm are uneconomic while thicknesses less than 0.3 μm are typically unsuitable because it is difficult to develop a wire bonding process that avoids damage to underlying circuitry.

For this first embodiment and for the subsequent embodiments to be described, passivation layer 36 is typically a high strength dielectric insulating material such as silicon oxides and/or silicon nitride and is formed as described in *Semiconductors and Electronic Devices*, $2^{nd}$ ed., Adir Bar-Lev, 1984 Similarly, the fabrication of the die structure up to the bonding pads is not critical and is described in numerous sources such as Bar-Lev supra. Deposition and delineation of the aluminum pad is described for example in Bar-Lev supra. Additionally, wire bonding processes involving the formation of a ball, for example, by electric arc processing and subsequent bonding using compression and ultrasonic sound is described in Harman supra.

In a second embodiment the thickness of at least ten of the aluminum bonding pads with pitch less than 65 μm for the die being processed is maintained at a thickness of 0.8 μm or less. Thicknesses greater than 0.8 μm are significantly more susceptible to deformation. Generally, thicknesses less than 0.3 μm, although not precluded, are undesirable because it is difficult to avoid damage to underlying circuitry during wire bonding. It is possible in this second embodiment to configure the compression ball as in the first embodiment to be larger than the distance between passivation edges. However, because the thinner aluminum bonding pad is not readily deformable, compression balls having diameters at least 1 μm smaller than the passivation opening, 40, are advantageously employed. Use of this smaller diameter ball is desirable because it allows smaller distances between adjacent wire bond pads while avoiding short circuits. For ball diameters larger than the passivation opening conditions as described for the first embodiment are suitable. For compression balls having diameters smaller than the passivation opening, typically compression forces in the range 2 to 20 grams are employed.

Figure 6:
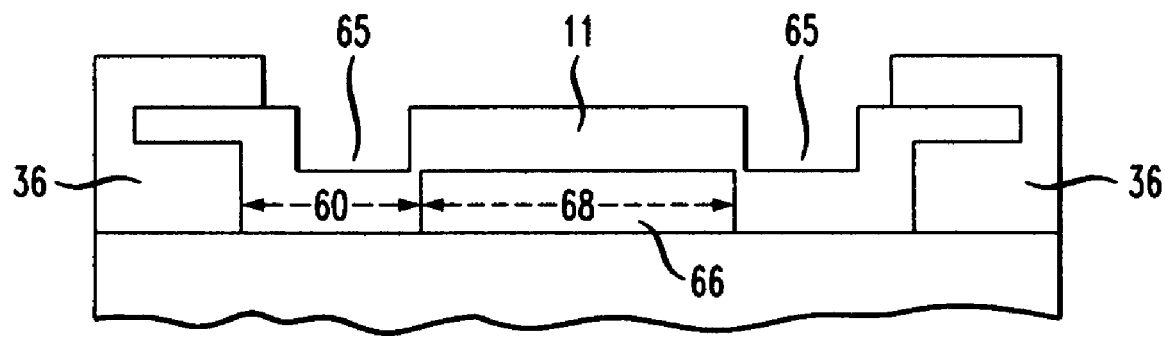
Figure 7:
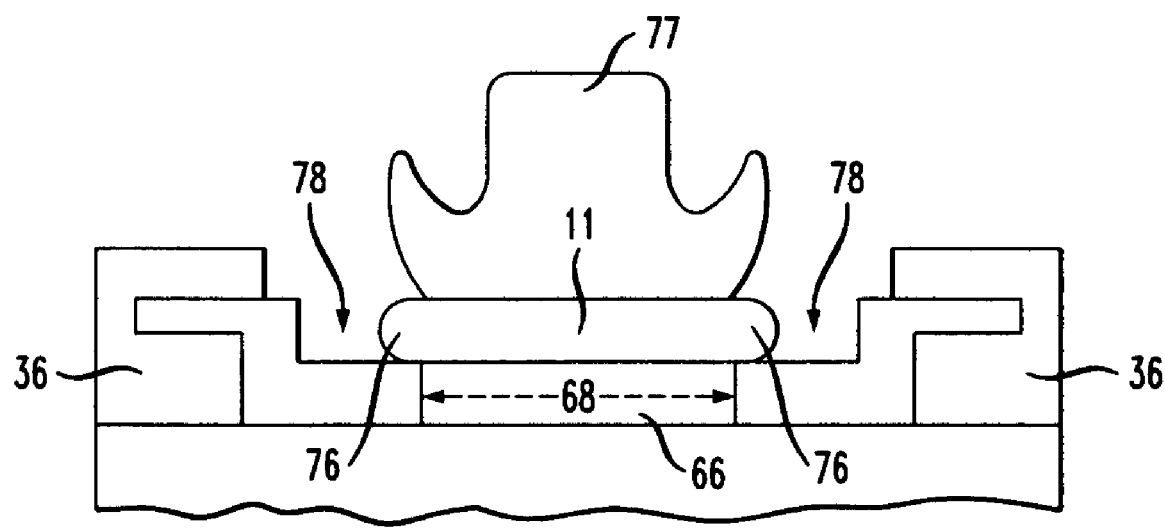

In a third embodiment, the structure of the die being fabricated is modified to include a passivation region, 66. This passivation region has 1) a thickness in the range 0.2 to 3 μm, 2) lateral dimension, 68, in the range 22 to 62 μm, and 3) openings, 60, with lateral dimension in the range 25 to 65 μm. This passivation region is employed so that the overlying aluminum metallization, 11, as shown in FIG. 6 has depressions, 65. For such configurations, these depressions are inherently formed over the passivation region by depositing the aluminum through processes such as sputtering as described in Bar-Lev supra. Subsequent compression bonding with ball 77 in FIG. 7 causes deformation of the aluminum, 76, into the openings 65 in a lateral direction. As a result, crevices which are not subsequently passivated are avoided since the overlying passivating material easily permeates openings 78.

Typically, the compression ball should have a diameter not greater than the passivation opening. Although not essential, it is often advantageous to have the ball diameter not greater than the lateral dimension, 68, of passivation region, 66. Additionally it is advantageous for the compression ball to have the dimensions relative to the passivation opening as described in conjunction with the second embodiment. Conditions employed for such bonding suitable for the second embodiment are also generally suitable for the third embodiment.

The bonding wire and the ball formed from such wire is typically gold or alternatively gold alloys. Suitable diameters for the wire are those that are 1.5 to 4 times smaller than the desired diameter of the bonding ball. Conditions in the electric arc formation of the ball are employed as described in Harmon supra to produce the desired diameter for such ball. After thermosonic bonding, the die is passivated using materials such as mold compounds. Advantageous materials avoid the use of bromine entities. However, the corrosion effects of encapsulation materials containing bromine entities are mitigated through the use of the invention. Thus, although not preferred, the use of such materials is not precluded.

The completion of the package including for example lead formation or solder ball attachments and post mold cure is conventional and described in *Microelectronics Packaging Handbook*, Tummala and Rymaszewski (1989).

The following examples are illustrative of some embodiments of the subject invention.

Example 1

Large Gold Ball Bonds

Wafers having fabricated integrated circuits produced to a design rule of 90 nm were purchased from a commercial source and diced into singulated individual dies. The dies had pad opening dimensions of 44 μm×44 μm. The aluminum pad thickness was 1.45 μm. The dies were attached to package substrates using Ablestix 2000 which is a commercially available die attach compound sold by. The wire used for the wire bond was 99.99 percent pure gold wire produced by Tanaka Kikinzoku International Headquarters: Marunouchi Trust Tower N-12F, 1-8-1, Marunouchi, Chiyoda-ku, Tokyo (100-0005) Japan. Attached dies were bonded using either a wire diameter of 0.0012 inches or 0.0009 inches. (The 0.0012 inch wire ensured complete coverage of the pad opening by a gold ball having a diameter of approximately 64 μm whereas the 0.0009 wire was approximately 41 μm and did not completely cover the pad.)

The package die assembly was exposed to 150 degrees C. for 30 minutes to cure the die attach epoxy. The bond pads were wire bonded as described above, using a commercially available wire bond apparatus manufactured by Kulicke & Soffa Industries, 1005 Va. Drive, Fort Washington, Pa. 19034. The conditions used for wire bonding were that recommended by the manufacturer of the wire bond equipment. The bonding force was approximately 20 to 25 grams, the ultrasonic energy was approximately 85 to 95 percent, and the bonding time was between 14 and 20 ms. The assembly was then over-molded using a commercially available mold compound (denominated HC100 manufactured by Nitto Corporation located at Nitto Denko Corporation of Herbis Osaka, 2-5-25, Umeda, Kita-Ku, Osaka 530-0001, Japan) in accordance with the manufacturer's specifications.

The packaged devices were tested by subjecting them to an ambient of 130 degrees C. at a relative humidity of 85 percent for time periods in the range of 96 to 288 hours. At 96 hour intervals a sampling of devices was removed from the test chamber and a subset of two devices was further removed from this population for characterization. The mold compound of the devices to be characterized was removed from the region of the devices where wire bonds were located. This removal was accomplished using sulfuric acid heated to 150 degrees C. Once the wires were exposed the pull strength of the wire was measured using a Royce model 550 pull strength tester. (The tester was manufactured by Royce Industries, 500 Gateway Drive, Napa, Calif. 94558.)

Figure 8:
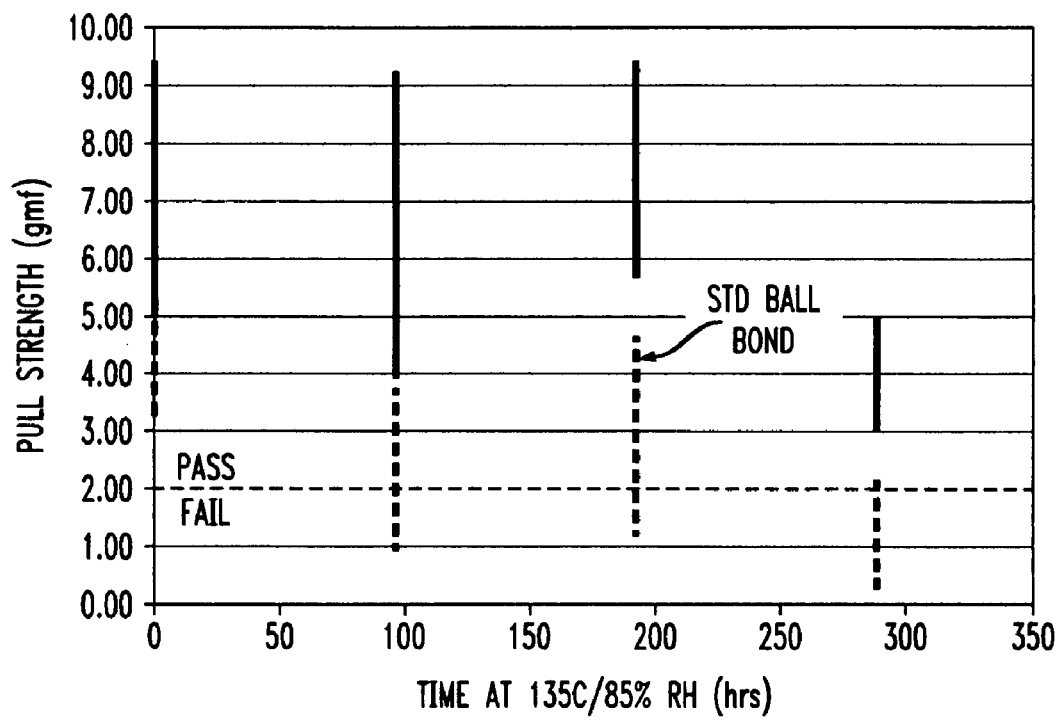
FIGS. 8 and 9 are illustrative of results associated with the invention.

FIG. 8 shows the results of the measurements. A device was considered satisfactory if it exhibited a pull strength greater than 2 grams after aging for 96 hours or more. Results for the larger ball bond are shown with solid lines and the results for standard ball bonds are shown with dotted lines. The pass/fail level is shown by a dashed line. As can be seen from FIG. 8, the wire bond strength for the devices having 0.0009 inch wire diameter (41 µm ball diameter) failed within 96 hours. In contrast, the wire bond strength of the devices assembled with the 0.0012 inch wire (64 µm ball) exhibited acceptable pull strength for the entire test duration of 288 hours.

Example 2

Integrated circuits having a 140 nm design rule fabricated on a silicon wafer were obtained from a commercial supplier. The procedure disclosed in example 1 was followed with the following exceptions. The die was attached using Abelstik 2300. The bonding force used for wire bonding was between 15 and 20 grams, the ultrasonic energy was approximately 80 to 90 percent and the bonding time was approximately 35 to 45 ms. The pad openings have dimensions of 60 µm by 75 µm with an aluminum pad thickness of 0.6 µm. The wire used for bonding had a diameter of 0.001 mils resulting in a ball diameter of approximately 46 µm (a diameter that fit within the confines of the bond pad opening).

Figure 9:
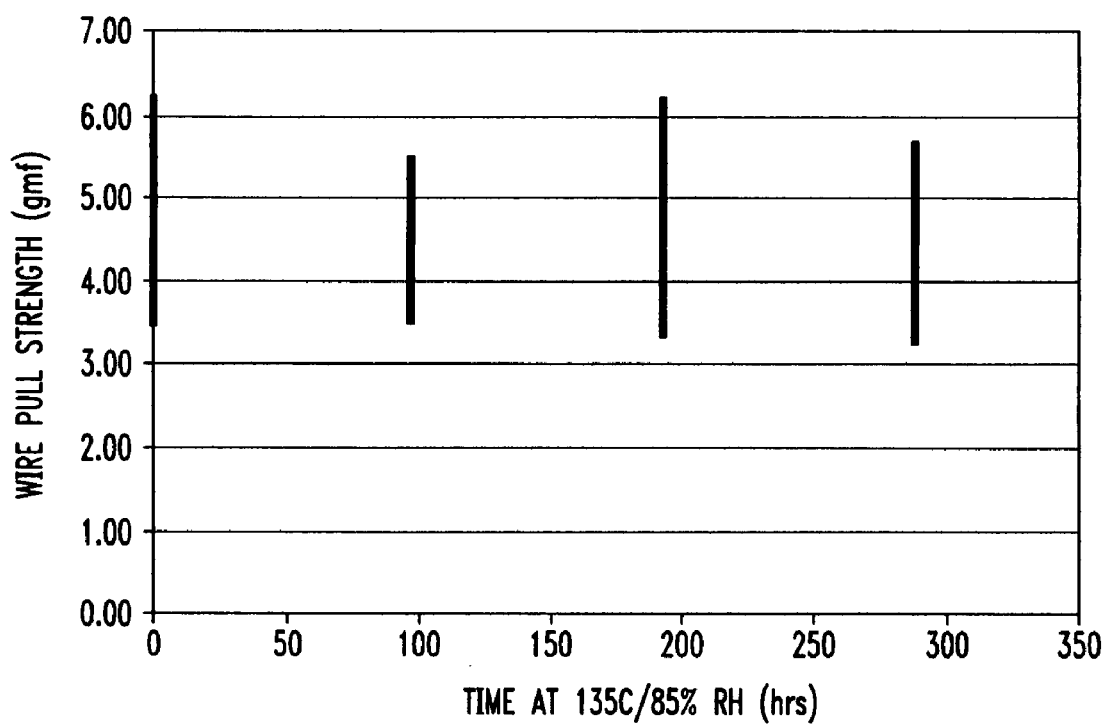

The results of testing are shown in FIG. 9 indicating that thinner aluminum pads lead to an acceptable device even after 288 hours of testing.

The invention claimed is:

1. A process for fabricating an integrated circuit package, said package comprising:
  1) an integrated circuit die including a bonding pad array,
  2) a substrate comprising electrical contact pads, and
  3) electrical communication structures with pitch of 65 µm or less, said structures comprising an electrically conducting wire compression bonded to a bonding pad of said array and bonded to at least one of said contact pads;
  said process comprising:
  contacting said wire to said bonding pad,
  then applying a force such that said wire is compression bonded to said bonding pad, and
  then covering said die with a passivating material wherein:
    said bonding pad comprises aluminum deposited at least partially over a passivation structure,
    said bonding pad is surrounded by a partially overlaying passivation region, and
    the configuration of said bonding pad before applying said force is such that, after applying said force, crevice formation between said bonding pad and said wire is substantially avoided.

2. The process of claim 1 wherein the thickness of said pads in less than 1.5 µm.

3. The process of claim 1 wherein said bonding pad has before application of said force voids underlying said wire into which said bonding pad distorts upon application of said force.

4. The process of claim 1 wherein said passivating material comprises a silicon oxide or silicon nitride.

5. The process of claim 1 wherein said passivating material includes bromine entities.

6. The process of claim 5 wherein said passivating material comprises an epoxy polymer.

7. The process of claim 1 wherein said force is in the range 2 to 20 grams.

8. The process of claim 1 wherein said pitch is 60 µm or less.

9. The process of claim 8 wherein said pitch is 55 µm or less.

10. The process of claim 1 wherein said force is applied using a capillary tube through which said wire passes.

11. A method for fabricating a bond pad on an integrated circuit, the method comprising:
  providing a semiconductor substrate;
  forming a first passivation layer on the substrate, the first passivation layer having a bond-pad opening having a first width and a passivation structure located within the bond-pad opening such that the passivation structure has a second width smaller than the first width;
  overlaying the bond-pad opening, including the passivation structure, with a metal layer such that the top of the metal layer substantially follows the contours of the underlying bond-pad opening so as to form a depression in the metal layer;
  forming a second passivation layer on the substrate, the second passivation layer having a passivation region surrounding and partially overlaying the metal layer; and
  then bonding a wire terminated with a wire ball to the metal layer of the bond pad by placing the wire ball over the passivation structure and applying a force such that the wire is compression bonded to the metal layer of the bond pad, wherein the metal layer over the passivation structure distorts into the depression.

12. The method of claim 11, wherein the metal layer comprises at least 95% aluminum.

13. The method of claim 11, wherein the metal layer over the passivation structure distorts laterally into the depression.

14. The method of claim 11, wherein the wire ball is bonded directly to the metal layer.

15. The method of claim 11, further comprising, following the bonding step, encapsulating the integrated circuit in a molding compound.

* * * * *